(12) United States Patent
Devilbiss

(10) Patent No.: US 6,639,459 B1
(45) Date of Patent: Oct. 28, 2003

(54) DEMODULATOR USING DIGITAL CIRCUITRY

(75) Inventor: Alan D. Devilbiss, Colorado Springs, CO (US)

(73) Assignee: Celio Semiconductor Corporation, Colorado Springs, CO (US)

( * ) Notice: Subject to any disclaimer, the term of this patent is extended or adjusted under 35 U.S.C. 154(b) by 0 days.

(21) Appl. No.: 10/133,924

(22) Filed: Apr. 25, 2002

(51) Int. Cl.[7] .................................................. H03D 3/00
(52) U.S. Cl. ...................... 329/341; 329/370; 375/320; 331/74
(58) Field of Search .............................. 331/74; 329/341, 329/347, 351, 353, 370; 375/320

(56) References Cited

U.S. PATENT DOCUMENTS 5,214,677 A * 5/1993 Mori ........................... 375/120
5,929,907 A * 7/1999 Yajima et al. ............... 348/351
6,392,495 B1 * 5/2002 Larsson ........................ 331/11

* cited by examiner

*Primary Examiner*—Henry Choe
(74) *Attorney, Agent, or Firm*—Mark G. Pannell; Hanes & Schutz, P.C.

(57) ABSTRACT

A demodulator converts a voltage input to an output voltage. The demodulator has a voltage-controlled oscillator (VCO), a counter, a holding apparatus, and a digital compare apparatus. The VCO generates a signal having a frequency proportional to the analog input voltage. The counter counts each cycle of the signal generated by the VCO and outputs a count signal representative of the cycle count. The holding apparatus holds the count signal and generates a held count signal. The digital compare apparatus compares the count signal and the held count signal and generates the digital output.

12 Claims, 5 Drawing Sheets

DEMODULATOR USING DIGITAL CIRCUITRY

FIELD OF THE INVENTION

This invention relates in general to demodulation, and more particularly, to a demodulator circuit utilizing a digital circuitry.

BACKGROUND OF THE INVENTION

Radio frequency identification (RFID) transponders (tags) are usually used in conjunction with an RFID base station, typically in applications such as inventory control, security, access cards, and personal identification. The base station transmits a carrier signal that powers circuitry in the RFID tag when the RFID tag is brought within a read range of the base station. Data communication between the tag and the station is achieved by modulating the amplitude of the carrier signal with a binary data pattern, usually amplitude shift keying. To that end, RFID tags are typically integrated circuits that include, among other components, antenna elements for coupling the radiated field, rectifiers to convert the AC carrier signal to dc power, and demodulators to extract the data pattern from the envelope of the carrier signal.

If fabricated at sufficiently low cost, RFID tags can also be useful in cost-sensitive applications such as product pricing, baggage tracking, parcel tracking, asset identification, authentication of paper money, and animal identification, to mention just a few applications. RFID tags could provide significant advantages over systems conventionally used for such applications, such as bar code identification systems. For example, a basket full of items marked with RFID tags could be read rapidly without having to handle each item, whereas they would have to be handled individually when using a bar code system. Unlike bar codes, RFID tags provide the ability to update information on the tag. However, the RFID technology of today is too expensive for dominant use in such applications.

One factor driving up the cost of conventional RFID tags is the size of the integrated circuit due to the use of analog circuitry. In particular, the circuitry that demodulates the binary pattern that envelops the carrier frequency typically uses analog circuitry such as operational amplifiers and voltage references. Such circuits use precise capacitors and resistors, which are relatively large in size and do not scale with the efficiency of digital circuitry. Further, the design of such circuitry requires very accurate circuit models that are typically only available for mature integrated circuit technologies. Therefore, RFID tags can typically not be manufactured using latest and smallest process technologies that benefit digital circuitry not utilizing analog circuits.

Another concern with demodulators used in convention RFID design techniques is the susceptibility to spikes. FIG. 1 illustrates a typical rectifying and demodulator circuit, as it is known in the prior art. Inductor 104 and capacitor 105 resonate at the carrier frequency. The envelope waveform is isolated on node 102 through the use of band-pass filter 109. The signal is then ac coupled through a capacitor to node 108, creating a short pulse in the negative or positive direction at the input of comparator 107. A high pulse indicates a "high state" in the envelope while a low pulse indicates a "low state" in the envelope. Differential amplifier 107 compares these pulses with a voltage reference 101, and will generate a "high" state or a "low state on output 103. In essence, this circuit isolates the envelope data signal by sensing the rise/fall time of the envelope signal. Since noise spikes tend to have fast rise and fall times, noise spikes tend to create erroneous output states. Further, since output 103 changes state only on the next rise/fall time of the envelop data of the carrier signal, output 103 will remain in an incorrect state until the next data transition is detected.

SUMMARY OF THE INVENTION

According to principles of the present invention, a demodulator converts a voltage input to an output voltage. The demodulator has a voltage-controlled oscillator (VCO), a counter, a holding apparatus, and a digital compare apparatus. The VCO generates a signal having a frequency proportional to the analog input voltage. The counter counts each cycle of the signal generated by the VCO and outputs a count signal representative of the cycle count. The holding apparatus holds the count signal and generates a held count signal. The digital compare apparatus compares the count signal and the held count signal and generates the digital output.

According to principles of the present invention, the VCO has an input terminal and output terminal. The counter has an input terminal, an output terminal, and a reset terminal. The holding apparatus has an input terminal, an output terminal, and a reset terminal. The digital compare apparatus has first and second input terminals and a reset terminal. The voltage input is coupled to the input terminal of the VCO, the output terminal of which is coupled to the input terminal of the counter. The output terminal of the counter is coupled to the input terminal of the holding apparatus. The output terminal of the counter and the output terminal of the holding apparatus are coupled to first input terminal and second input terminal of the digital compare apparatus. The reset terminal of the counter, holding apparatus, and digital compare apparatus are coupled to the reset clock.

According to further principles of the present invention, the VCO has includes an n-channel MOSFET device, a storage capacitor, a p-channel MOSFET, and a Schmidt Trigger. The n-channel MOSFET device has source, drain, and gate terminals. The storage capacitor has first and second terminals. The p-channel MOSFET has drain, source, and gate. The Schmidt Trigger has input, output, and reset terminals. The gate of the n-channel MOSFET is coupled to the input voltage, the source is coupled to ground, and the drain is coupled to the first terminal of the storage capacitor. The second terminal of the storage capacitor is coupled to the power supply. The drain of the pchannel MOSFET is coupled to the first terminal of the storage capacitor and the input terminal of the Schmidt trigger. The source of the p-channel device is coupled to the power supply. The gate of the p-channel MOSFET is coupled to the output of the Schmidt trigger. The output of the Schmidt trigger provides the output voltage.

DETAILED DESCRIPTION OF THE INVENTION

Figure 2:
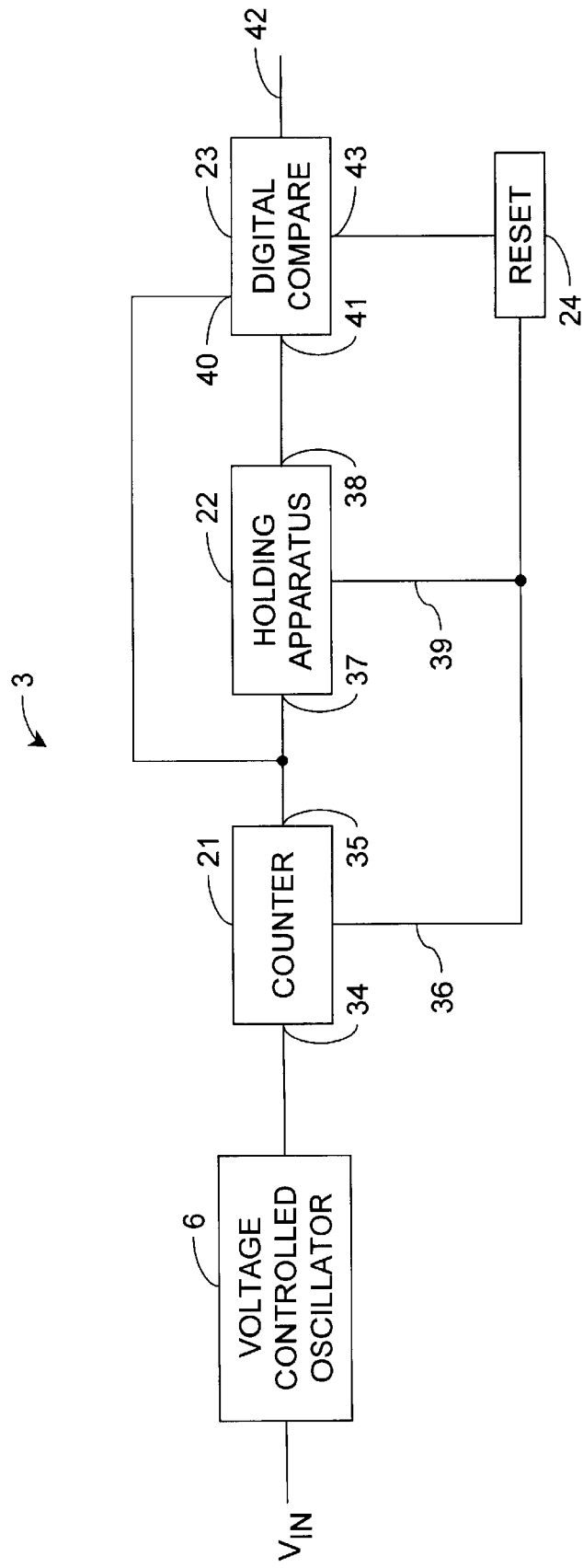
FIG. 2 is a block diagram of one embodiment of the present invention demodulator.

Illustrated in FIG. 2 is a block diagram of one embodiment of the present invention demodulator 3 for converting an analog input voltage to an output voltage. Demodulator 3 includes voltage-controlled oscillator (VCO) 6, counter 21, holding apparatus 22, and digital compare apparatus 23. Supplying demodulator 3 are an analog input voltage Vin and a reset clock 24.

VCO 6 is any device or system configured to generate a signal having a frequency proportional to analog input voltage Vin. In one embodiment, VCO 6 has an input terminal and an output terminal. The analog input voltage Vin is applied to the input terminal. The VCO signal having a frequency proportional to analog input voltage Vin is generated at the output terminal.

Counter 21 is any device or system configured to count each cycle of the signal generated by the VCO and output a count signal representative of the cycle count. Although counter 21 is represented in FIG. 2 as a single counter, counter 21 may be embodied by one or more than one counter or a combination of elements acting as a counter.

In one embodiment, counter 21 has an input terminal 34, an output terminal 35, and a reset terminal 36, Input terminal is coupled to the output terminal of VCO 6. Reset terminal 36 is connected to reset clock 24. The count signal is output at output terminal 35.

Holding apparatus 22 is any device or system configured to hold the count signal and generate a held count signal. Examples of holding apparatus 22 include a flip-flop, a sample and hold circuit, a memory, and a latch. Although holding apparatus 22 is represented in FIG. 2 as a single holding apparatus, holding apparatus 22 may be embodied by one or more than one holding apparatus 22 or a combination of elements acting as a holding apparatus.

In one embodiment, holding apparatus 22 has an input terminal 37, an output terminal 38, and a reset terminal 39. Input terminal 37 is connected to output terminal 35 of counter 21. Reset terminal 39 is coupled to reset clock 24.

Digital compare apparatus 23 is any device or system configured to compare the count signal and the held count signal and generate the digital output. Although digital compare apparatus 22 is represented in FIG. 2 as a single digital compare apparatus, digital compare apparatus 23 may be embodied by one or more digital compare apparatus 23 or a combination of elements acting as a digital compare apparatus.

In one embodiment, digital compare apparatus 23 has a first input terminal 41, a second input terminal 40, an output terminal 42, and a reset terminal 43. First input terminal 41 is connected to output 38 of holding apparatus 22. Second input terminal 40 is connected to output 35 of counter 21. Reset terminal 43 is connected to reset clock 24. The digital output is generated on output terminal 42.

In one embodiment, analog input voltage Vin is proportional to a magnitude of a carrier signal modulated by a binary pattern. The digital output voltage at output terminal 42 includes a stream of binary data corresponding to the binary pattern that modulates the carrier signal.

Figure 3:
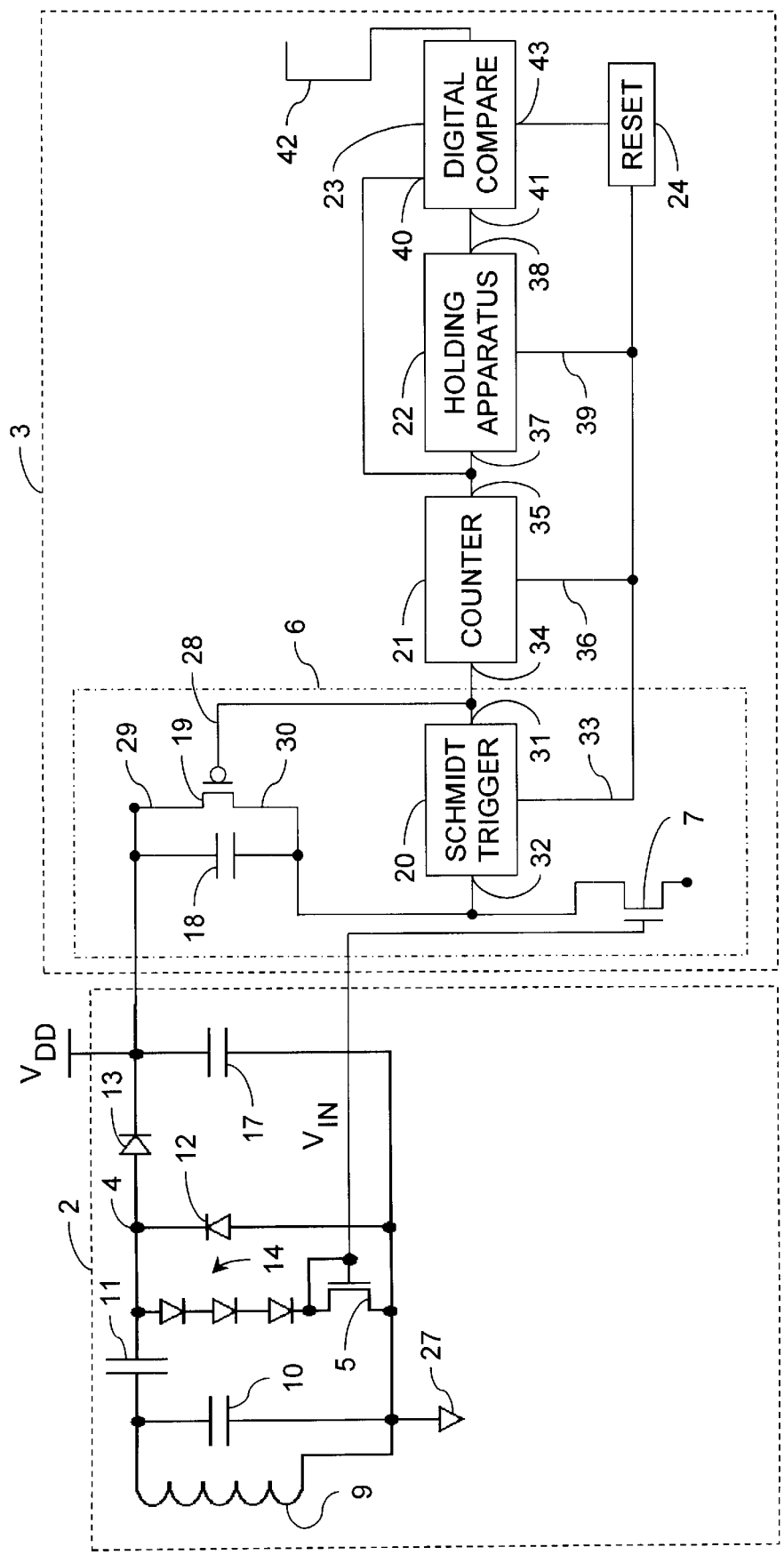
FIG. 3 is a schematic diagram illustrating one embodiment of the present invention, showing details of one embodiment of the VCO of FIG. 2.

Shown in FIG. 3 are rectifier circuit 2 and demodulator circuit 3. Rectifier circuit 2 is included to illustrate the operation of demodulator 3. Rectifier circuit 2 is not an integral part of the present invention. In one embodiment, demodulator circuit 3 and at least part of rectifier circuit 2 are embodied in an integrated circuit chip. Additional circuitry (not shown) may also be embodied in the integrated circuit with demodulator circuit 3. In one embodiment, demodulator circuit 3 is included as a demodulator for a radio frequency identification (RFID) transponder (tag). Other uses for demodulator circuit 3 are possible.

In one embodiment, VCO 6 includes a Schmidt trigger 20, a storage capacitor 18, a first transistor 7, and a second transistor 19. Schmidt trigger 20 has an input terminal 32, an output terminal 31, and a reset terminal 33. The reset terminal is coupled to reset clock 24.

First transistor 7 is any device or apparatus acting as an electronic or optical switch. Although transistor 7 is represented in FIG. 3 as a single transistor, transistor 7 may be embodied by one or more than one transistor or a combination of elements acting as a transistor. In one embodiment, transistor has a source terminal, a drain terminal, and a gate terminal. The drain terminal is coupled to capacitor 18 and input 32 of Schmidt trigger 20. The source terminal is coupled to ground. The gate is coupled to input voltage Vin.

Schmidt trigger 20 has an input terminal 32, an output terminal 31, and a reset terminal 33. Input terminal 32 is connected to drain 30 of transistor 7. Output terminal 31 is connected to gate 28 of transistor 19. Reset terminal 33 is connected to reset clock 24.

Transistor 19 is any device or apparatus acting as an electronic or optical switch. Although transistor 19 is represented in FIG. 3 as a single transistor, transistor 19 may be embodied by one or more than one transistor or a combination of elements acting as a transistor. In one embodiment, transistor 19 is a MOSFET and has a gate terminal 28, a source terminal 29, and a drain terminal 30. Drain terminal 30 is coupled to input 32 of Schmidt trigger 20. Source terminal 29 is coupled to a power supply voltage Vdd. Gate terminal 28 is coupled to output 31 of Schmidt trigger 20.

Capacitor 18 is any device or apparatus acting as a capacitor for storing and releasing charge. Although capacitor 18 is represented in FIG. 3 as a single capacitor, capacitor 18 may be embodied by one or more than one capacitor or a combination of elements acting as a capacitor. In one embodiment, capacitor 18 is coupled between source terminal 30 of second transistor 19, and power supply voltage Vdd. One terminal of capacitor 18 is coupled to source terminal 30 of second transistor 19, the drain of transistor 7, and input terminal 32 of Schmidt trigger 20. The other terminal of capacitor 18 is coupled to power supply voltage Vdd.

In one embodiment, the input of rectifier circuit 2 is a carrier frequency radiated from a base station wherein the carrier amplitude is enveloped by a data pattern. One example of a carrier amplitude enveloped by a data pattern is amplitude shift keying. One output of rectifier circuit 2 is a rectified output produced at node 4. The rectified output is utilized to generate a tracking current through transistor 5 and mirrored through transistor 7 on the input of demodulator circuit 3. Another output of rectifier circuit 2 is power output Vdd, which could be used as a dc power source for rectifier circuit 2 and demodulator circuit 3 to generate power supply (Vdd). Rectifier circuit 2 includes antenna element 9, tuning capacitor 1 0, coupling capacitor 11, first rectifying diode 12, second rectifying diode 13, rectifying diode stack 14, transistor 5 and storage capacitor 17. Demodulator circuit 3 includes input transistor 7, a capacitor 18, a transistor 19, a Schmidt trigger 20, a counter 21, a holding apparatus 22, a digital compare apparatus 23, and a reset clock 24.

In one embodiment, antenna element 9 has first and second terminals. The first terminal of antenna element 9 is coupled to a resonating node 26. The second terminal of antenna element 9 is connected to ground 27.

In one embodiment, antenna element 9 is an inductor. Inductor 9 and capacitor 10 are chosen to resonate the carrier frequency. Inductor 9 is external to the integrated circuit chip in this embodiment, but could also be internal to the integrated circuit. Further, the integrated circuit process could include a high magnetic permeability layer to increase the inductance of the antenna element.

In one embodiment, antenna element 9 is conductive ink printed on paper or other media. In alternative embodiments, antenna element 9 is any other type of inductive element.

Tuning capacitor 10 is connected in parallel with antenna 9 between resonating node 26 and ground 27. In one embodiment, tuning capacitor 10 has first and second terminals. The first terminal of tuning capacitor 10 is connected to the first terminal of antenna 9 and the second terminal of tuning capacitor 10 is connected to the second terminal of antenna 9. When rectifier circuit 2 is brought within reading range of a base station radiating the appropriate carrier frequency, the voltage on node 26 will resonate. Capacitor 10 is internal to the integrated circuit in one embodiment, but could also be external to the integrated circuit.

In one embodiment, tuning capacitor 10 is conductive ink printed on paper or other media. In alternative embodiments, tuning capacitor 10 is any other type of capacitive element.

Coupling capacitor 11 is connected to resonating node 26, coupling the voltage to node 4. In one embodiment, coupling capacitor 11 has first and second terminals. The first terminal of coupling capacitor 11 is connected to the first terminal of antenna element 9 and the second terminal of coupling capacitor 11 is connected to first rectifying diode 12, second rectifying diode 13, and a third rectifying diode 14.

In one embodiment, coupling capacitor 11 is conductive ink printed on paper or other media. In alternative embodiments, coupling capacitor 11 is any other type of capacitive element.

First rectifying diode 12 is coupled between the second terminal of coupling capacitor 11 and ground 27. In one embodiment, first rectifying diode has an anode terminal and a cathode terminal. The anode terminal is connected to ground and the cathode terminal is connected to the second terminal of the coupling capacitor 11. The rectified output is generated at the cathode terminal.

First rectifying diode 12 will forward-bias when a negative voltage is coupled to node 4, thereby keeping the voltage on node 4 no lower than one diode drop below ground 27. The voltage on node 4 can achieve the same peak-to-peak amplitude as resonating node 26, twice the peak-to-peak amplitude of the rectified output of a conventional rectifier.

Second rectifying diode 13 is connected between the rectified output node 4 and power output Vdd. In one embodiment, second rectifying diode 13 has an anode terminal and a cathode terminal. The anode is connected to the second terminal of the coupling capacitor 11 and cathode terminal is connected to storage capacitor 17.

Rectifying diode stack 14 is connected between rectified output node 4 and the drain and gate of transistor 5. In one embodiment, rectifying diodes stack 14 has an anode terminal and a cathode terminal. The anode of rectifying diode stack 14 is connected to the second terminal of coupling capacitor 11 and the cathode is connected to the gate and the drain of transistor 5. The source of transistor 5 is connected to ground 27. Rectifying diode stack 14 limits the voltage on node 4 in the case when the amplitude of the carrier signal, the proximity of rectifier circuit 2 to the base station, or the coupling efficiency of the radiated fields generate voltages sufficiently large as to cause permanent damage to the integrated circuit components. The voltage generated on the gate of transistor 5 is applied to the gate of transistor 7, thereby generating the same current through transistor 7 as is flowing through transistor 5.

Storage capacitor 17 is coupled between power output Vdd and ground 27. In one embodiment, storage capacitor 17 has first and second terminals. The first terminal is connected to the cathode terminal of the second rectifying diode 13 and the second terminal is connected to ground 27.

When the voltage on node 4 is more positive than the voltage on power output Vdd, second rectifying diode 13 will forward-bias, thereby charging capacitor 17 to the peak voltage of node 4 less one diode drop. The charge on capacitor 17 is used as power for rectifying circuit 2 and demodulator circuit 3, and is refreshed at the carrier frequency.

Figure 4:
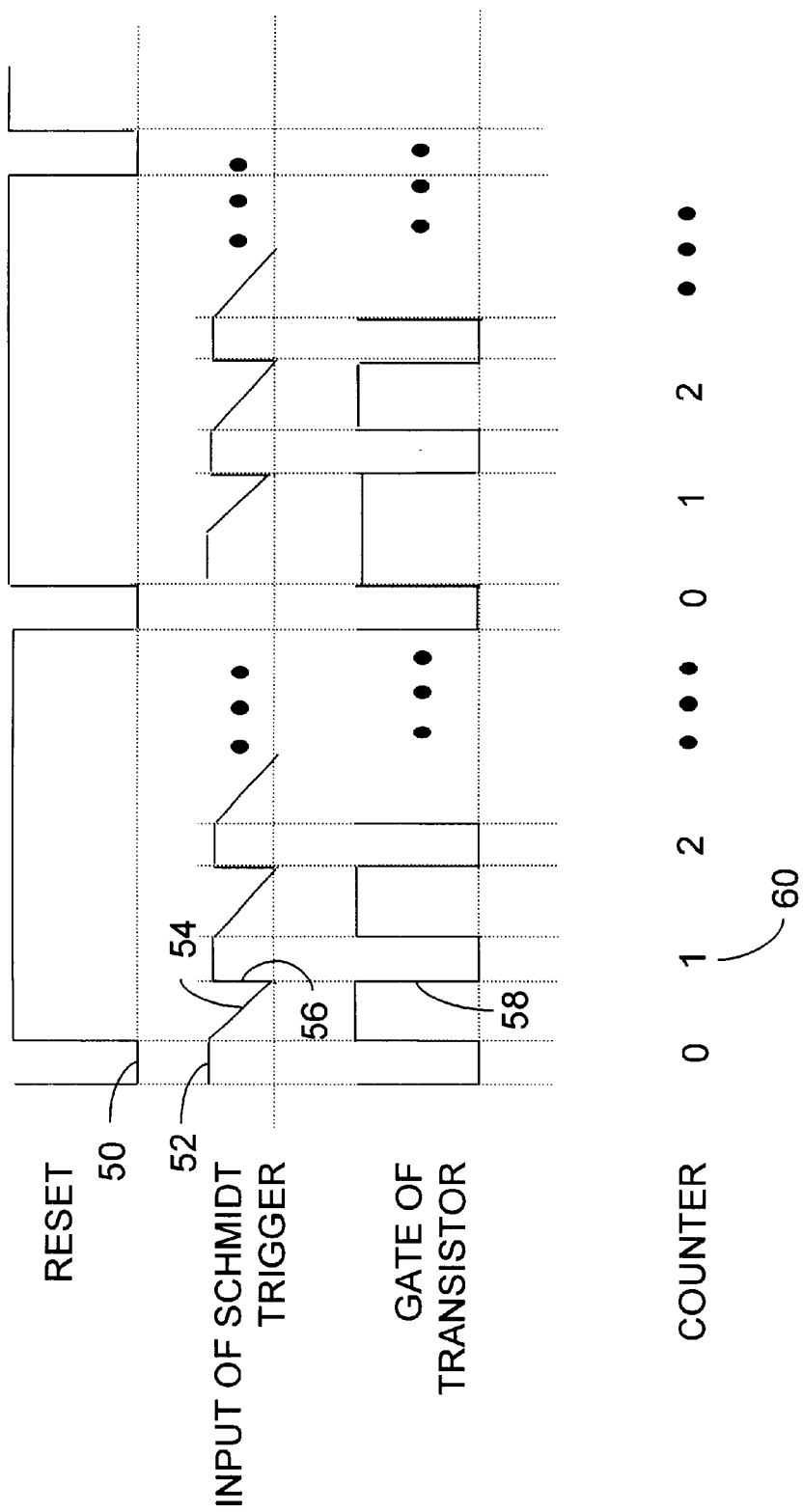
FIG. 4 is a timing diagram of selected nodes in the schematic circuit diagram presented in FIG. 3.

FIG. 4 illustrates the operation of demodulator 3. In operation, when reset clock 24 goes low, Schmidt trigger 20 is triggered, resetting the output of counter 21 to 0. The output of Schmidt trigger 20 will turn on MOSFET 19, thereby shorting capacitor 18 and charging input terminal 32 of Schmidt trigger 20 to the power supply voltage Vdd. Markers 50 and 52 in FIG. 4 show the levels of reset clock 24 and input terminal 32 of Schmidt trigger 20 at that time point on a waveform diagram, respectively. When reset clock 24 returns to a high state, input terminal 32 of Schmidt trigger 20 is left floating at the power supply voltage Vdd.

The gate of transistor 7 is connected to the gate of transistor 5, thereby generating a current through transistor 7 that tracks with the demodulated signal on node 4. As the voltage on transistor 7 changes, the current drawn by transistor 7 will change correspondingly. Since the charge on capacitor 18 is floating, the current drawn will decrease the voltage on input terminal 32 of Schmidt trigger 34 as a function of time. This voltage decrease on input terminal 32 of Schmidt trigger 20 is marked on the waveform in FIG. 4 with the number 54. Note that the time scale on FIG. 4 is not to scale. The length of time that input terminal 32 of Schmidt trigger 20 stays at Vdd is very short compared to the entire cycle, and is exaggerated in FIG. 4 for purposes of illustration.

When input terminal 32 of Schmidt trigger 20 drops to a given voltage level threshold, Schmidt trigger 20 fires, causing the voltage on gate terminal 28 of transistor 19 to go to a low state, thereby again shorting capacitor 18 through MOSFET 19 and returning input terminal 32 of Schmidt trigger 20 to the power supply voltage Vdd. At the same time, Schmidt trigger output 34 will increment counter 21. The wave shapes of input terminal 32 of Schmidt trigger 20 and gate terminal 28 of transistor 19 at this time point are marked 56 and 58 in FIG. 4, respectively. Marker 60 in FIG. 4 represents the corresponding increment of counter 21.

The output of Schmidt trigger 20 will now turn off MOSFET 19, leaving input terminal 32 of Schmidt trigger 20 floating at the power supply voltage Vdd once again. This cycle then repeats until the next low edge of pulse from reset clock 24, incrementing counter 21 every time Schmidt trigger 20 is triggered.

When reset clock 24 goes to a low state, the counter data is latched into holding apparatus 22, counter 21 is reset to 0, and Schmidt trigger 20 is triggered. Input terminal 32 of Schmidt trigger 10 is thereby charged to the power supply voltage Vdd. The count that is now latched in holding apparatus 22 represents data output 12, a digital representation of the Vin 18 during the time between the RESET pulses. The cycle described above then repeats.

Before the data in counter 21 is transferred to holding apparatus 22 in the next cycle, data in counter 21 and holding apparatus 22 are compared with digital compare apparatus 23. At that point in time, holding apparatus 22 holds the data from the previous cycle. Therefore, output 42 of digital compare apparatus 23 can be used to determine if a negative or positive data transition occurred in the envelope data between the previous cycle and the present cycle. Specifically, if the digital value in counter 21 is higher than in holding apparatus, then a positive transition occurred in the envelope data. Similarly, if the digital value in counter 21 is lower than in holding apparatus 22, then a negative transition occurred in the envelope data. If the digital value in counter 21 and apparatus 22 are the same, then no transition occurred in the envelope data.

Figure 1:
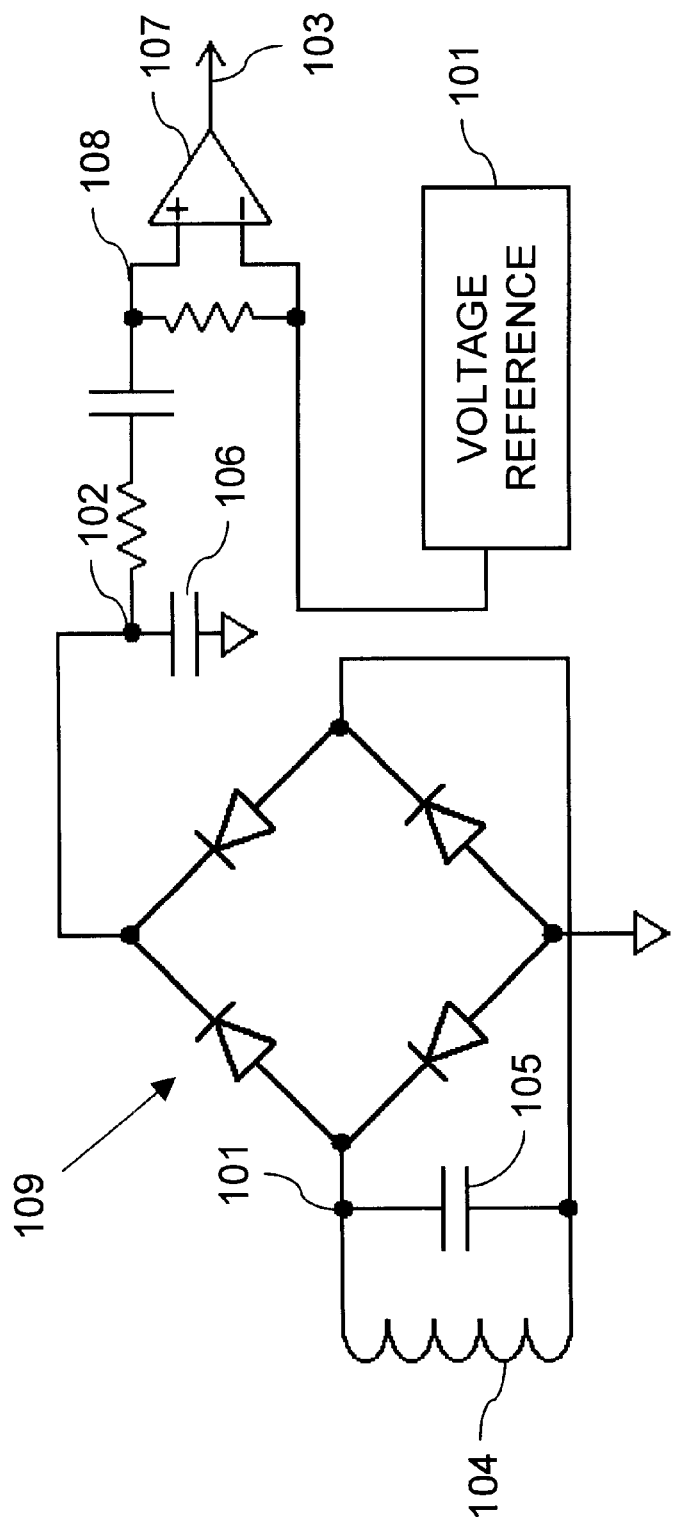
FIG. 1 is a schematic circuit drawing showing prior art design of a conventional demodulator utilizing voltage references and operational amplifiers.
Figure 5:
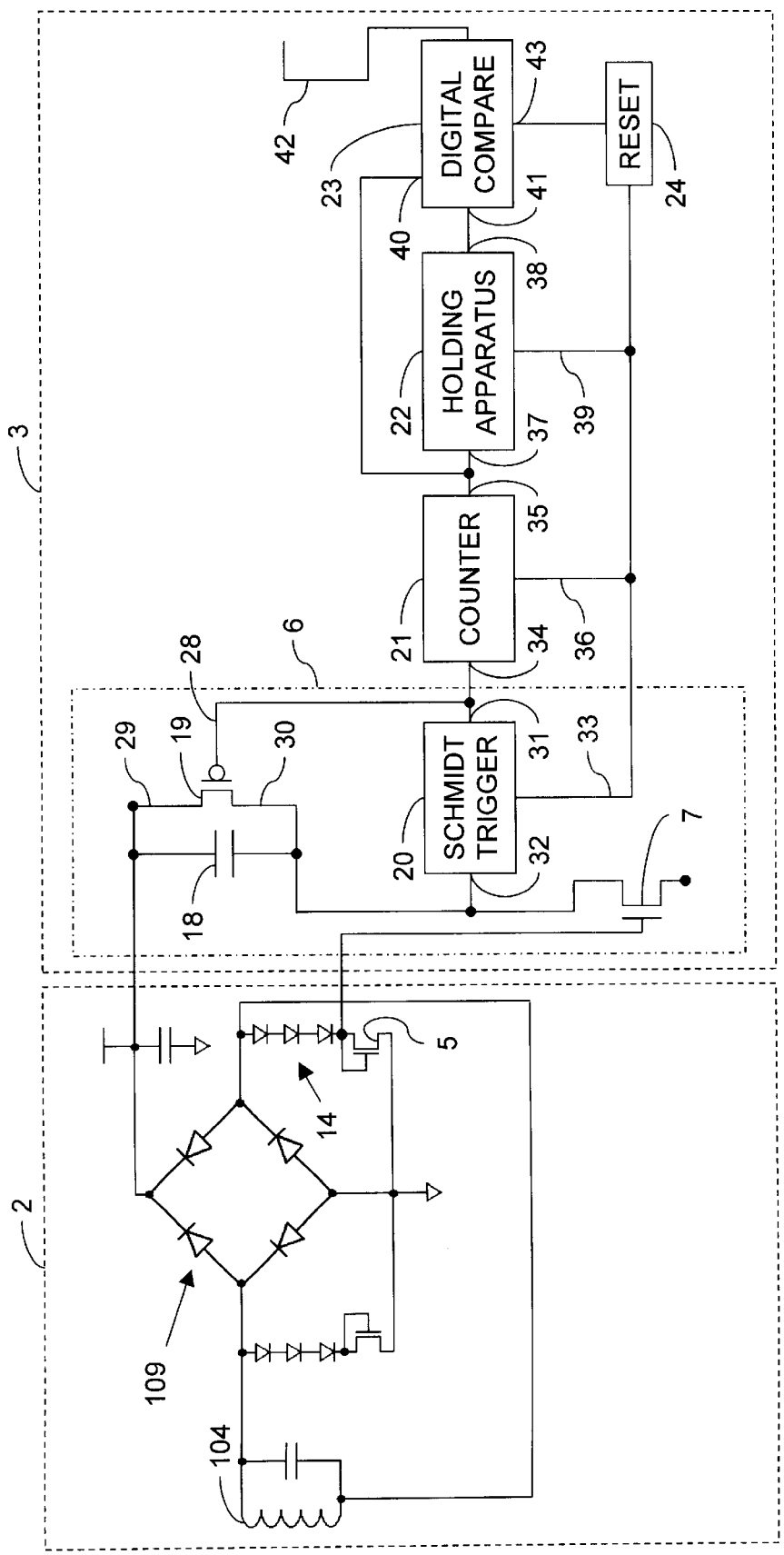
FIG. 5 is a schematic diagram illustrating one embodiment of the present invention, showing details of an alternate embodiment of the VCO of FIG. 2.

FIG. 5 is a schematic illustrating an alternate embodiment wherein demodulator 3 is used with a conventional rectifier 2 like the one shown in FIG. 1. Rectifier 2 has both terminals of antenna 104 coupled to band pass filter 109. The input voltage of the demodulator on the gate of transistor 7 is generated by coupling a series connection of diode stack 14 and current mirror transistor 5 between the output of band pass filter 109 and ground.

The foregoing description is only illustrative of the invention. Various alternatives and modifications can be devised by those skilled in the art without departing from the invention. In particular, wherever a device is connected or coupled to another device, additional devices may be present between the two connected devices. Accordingly, the present invention embraces all such alternatives, modifications, and variances that fall within the scope of the appended claims.

What is claimed is:

1. A demodulator for converting an analog input voltage to an output voltage, the demodulator comprising:
   (a) a voltage-controlled oscillator (VCO) configured to generate a signal having a frequency proportional to the analog input voltage;
   (b) a counter configured to count each cycle of the signal generated by the VCO and output a count signal representative of the cycle count;
   (c) a holding apparatus configured to hold the count signal and generate a held count signal and
   (d) a digital compare apparatus configured to compare the count signal and the held count signal and generate the digital output.

2. The demodulator of claim 1 wherein the holding apparatus is selected from the group consisting of a flip-flop, a sample and hold circuit, a memory, and a latch.

3. The demodulator of claim 1 wherein the analog input voltage is proportional to a magnitude of a carrier signal modulated by a binary pattern and the output voltage includes a stream of binary data corresponding to the binary pattern that modulates the carrier signal.

4. A method for converting an analog input voltage to an output voltage, method comprising:
   (a) generating a voltage signal having a frequency proportional to the analog input voltage source;
   (b) counting the cycles of the voltage signal and generating a count signal representative of the cycle count;
   (c) holding the count signal;
   (d) resetting the cycle count;
   (e) counting the cycles of the voltage signal and generating a count signal representative of the cycle count;
   (f) comparing the count signal with the held count signal; and
   (g) generating the output voltage from the comparison of the count signal with the held count signal.

5. The method of claim 4 wherein the count signal higher than the held count signal produces a positive transition in the output voltage.

6. The method of claim 4 wherein the count signal lower than the held count signal produces a negative transition in the output voltage.

7. The method of claim 4 wherein the count signal the same as the held count signal produces no transition in the output voltage.

8. The method of claim 4 wherein the analog input voltage is proportional to a magnitude of a carrier signal modulated by a binary pattern and generating the output voltage includes generating a stream of binary data corresponding to the binary pattern that modulates the carrier signal.

9. A demodulator for converting an analog input voltage to an output voltage, the demodulator supplied with a power supply voltage source and a reset clock, the demodulator comprising:
   (a) a voltage-controlled oscillator (VCO) having an input terminal and an output terminal, the analog input voltage applied to the input terminal, the VCO configured to generate a signal having a frequency at the output terminal proportional to the analog input voltage source applied to the input terminal;
   (b) a counter having an input terminal, an output terminal, and a reset terminal, the input terminal coupled to the output terminal of the VCO and the reset terminal connected to the reset clock;
   (c) a holding apparatus having an input terminal, an output terminal, and a reset terminal, the input terminal connected to the output terminal of the counter and the reset terminal coupled to the reset clock; and
   (d) a digital compare apparatus having first and second input terminals, an output terminal, and a reset terminal, the first input terminal connected to the output of the holding apparatus, the second input terminal connected to the output of the counter, and the reset terminal connected to the reset clock, the digital compare apparatus configured to provide the digital output at the output terminal.

10. The demodulator of claim 9 wherein the holding apparatus is selected from the group consisting of a flip-flop, a sample and hold circuit, a memory, and a latch.

11. The demodulator of claim 9 wherein the voltage controlled oscillator comprises:
   (a) a Schmidt trigger having an input terminal, an output terminal, and a reset terminal, the reset terminal coupled to the reset clock;
   (b) a storage capacitor having first and second terminals, the first terminal connected to the power supply source and the second terminal coupled to the input of the Schmidt trigger;

(c) a first transistor having a source terminal, a drain terminal, and a gate terminal, the drain terminal coupled to second terminal of the capacitor and the input of the Schmidt trigger, the source terminal coupled to ground, and the gate coupled to the input voltage; and (d) a second transistor having a source terminal, a drain terminal, and a gate terminal, the drain terminal coupled to second terminal of the capacitor and the input of the Schmidt trigger, the source terminal coupled to power supply source, and the gate coupled to the output of the Schmidt trigger.

12. The demodulator of claim 9 wherein the analog input voltage is proportional to a magnitude of a carrier signal modulated by a binary pattern and the output voltage includes a stream of binary data corresponding to the binary pattern that modulates the carrier signal.

\* \* \* \* \*

UNITED STATES PATENT AND TRADEMARK OFFICE
CERTIFICATE OF CORRECTION

PATENT NO. : 6,639,459 B1
DATED : October 28, 2003
INVENTOR(S) : Alan D. DeVilbiss It is certified that error appears in the above-identified patent and that said Letters Patent is hereby corrected as shown below:

<u>Title page,</u>
Item [73], Assignee, insert: -- Celis Semiconductor Corporation --

Signed and Sealed this

Twenty-seventh Day of January, 2004

JON W. DUDAS
*Acting Director of the United States Patent and Trademark Office*